United States Patent
Zetterlund et al.

(10) Patent No.: US 6,816,521 B2
(45) Date of Patent: Nov. 9, 2004

(54) PHOTONIC DEVICE WITH MONITOR

(75) Inventors: Erik Zetterlund, Stockholm (SE); Christer Eriksson, Stockholm (SE); John Frode, Sollentona (SE)

(73) Assignee: Zarlink Semiconductor AB, Jarfalla (SE)

( * ) Notice: Subject to any disclaimer, the term of this patent is extended or adjusted under 35 U.S.C. 154(b) by 0 days.

(21) Appl. No.: 10/431,880

(22) Filed: May 8, 2003

(65) Prior Publication Data

US 2004/0028093 A1 Feb. 12, 2004

(30) Foreign Application Priority Data

May 8, 2002 (GB) .............................. 0210411

(51) Int. Cl.[7] .............................. H01S 3/13; H01S 3/04; H01S 3/00
(52) U.S. Cl. ..................... 372/29.021; 372/36; 372/33
(58) Field of Search .............................. 372/29.021, 33, 372/36

(56) References Cited

U.S. PATENT DOCUMENTS

| | | | |
|---|---|---|---|
| 5,052,005 A | * | 9/1991 | Tanaka et al. ............... 372/36 |
| 5,606,572 A | | 2/1997 | Swirhun et al. ............... 372/96 |
| 5,732,101 A | * | 3/1998 | Shin ............................. 372/92 |
| 5,835,514 A | * | 11/1998 | Yuen et al. .................... 372/36 |
| 5,900,619 A | * | 5/1999 | Honda et al. ............. 250/201.5 |

FOREIGN PATENT DOCUMENTS

| | | |
|---|---|---|
| EP | 0 406 506 A1 | 1/1991 |
| JP | 630222474 | 9/1988 |

* cited by examiner

Primary Examiner—Quyen Leung
(74) Attorney, Agent, or Firm—Lawrence E. Laubscher, Jr.

(57) ABSTRACT

A photonic device has a semiconductor substrate with an active photosensitive surface generating a photocurrent dependent on the intensity of light falling on it. A light emitting element, typically a VCSEL, having a lower electrode is located on a contact element in the middle of the active surface. The light emitting element covers the contact element. A doped conductive path within the substrate establishes electrical connection between the contact element and a peripheral bonding pad. The doped path preferably constitutes the entirety of the upper layer forming the photosensitive surface.

21 Claims, 1 Drawing Sheet

PHOTONIC DEVICE WITH MONITOR

BACKGROUND OF THE INVENTION

1. Field of the Invention

This invention relates to the field of photonics, and in particular to a photonic device with a light source, such as a VCSEL (Vertical Cavity Surface Emitting Laser), and a power monitor.

2. Description of Related Art

VCSELs are increasingly used as light sources in fiber optics applications. They have considerable advantages over edge emitting lasers. Some means must generally be provided to control the output of the VCSEL. It is known to reflect a portion of the light back from an output lens onto a detector, typically a PIN diode located adjacent the VCSEL. The VCSEL is usually mounted on top of the PIN diode. The PIN diode generates a control signal dependent on the output power of the VCSEL, and this is used in a feedback loop to control the output power of the VCSEL.

U.S. Pat. No. 5,812,582 describes a technique wherein the VCSEL is mounted on a metallic mask that extends beyond an area covered by the VCSEL. This is necessary because the metallic mask also serves as a bottom contact for the VCSEL, and some means must be provided to supply power into the VCSEL. One problem with this arrangement is that by shadowing part of the diode, the mask decreases the efficiency of the diode since light falling on the mask will not contribute to the output of the diode.

In addition, the mask affects the relationship between the output power of the VCSEL and the magnitude of the photocurrent generated so that the photocurrent is not proportional to the power. This happens because the field is non uniform. The proportion of light output striking the active area of the PIN diode can change with changing power levels. This results in non-linearity in the output of the VCSEL.

SUMMARY OF THE INVENTION

According to the present invention there is provided a photonic device comprising a semiconductor substrate having an active photosensitive surface for generating a photocurrent dependent on the intensity of light falling thereon; a metallic contact element formed on said active surface; a light emitting element having a lower electrode, said light emitting element being disposed on said active surface to cover said metallic contact element with said lower electrode bonded to said contact element; a peripheral bonding pad for electrical connection to said contact element; and a doped conductive path within said substrate for establishing electrical connection between said contact element and said peripheral bonding pad.

The doped path is preferably in the form of a doped layer so that current flows uniformly in all directions from a centrally located contact element. In practice, it has been found that upper doped p layer of a PIN diode forming the active surface can have sufficient conductivity to establish electrical connection to the bottom contact of a VCSEL if the current is permitted to flow in all directions from a centrally mounted frame to a peripheral contact pad. This arrangement compensates for the reduced conductivity of a semiconductive material relative to a metal.

The idea of using the doped layer of the PIN diode as a conductive path to the contact pad for the light emitting device results in considerable efficiencies since none of the light falling outside the VCSEL is masked, and also the non-linear problem can be avoided, especially if the VCSEL is symmetrically arranged at the centre of the active surface.

By eliminating the metal contact extending over the active surface, the invention is able to avoid many of the problems of the prior art. The applicants have found surprisingly that by taking advantage of the conductivity of the upper p layer of a PIN diode, this layer can serve the dual purpose of supplying power to the bottom contact of the VCSEL and forming the top surface of the PIN diode. This surface is preferably covered with a passivation layer or antireflective coating in a conventional manner.

In another aspect the invention provides a method of making a photonic device comprising providing a semiconductor substrate having a photosensitive active surface, said semiconductor substrate having a doped layer providing a conductive path between an inner region thereof and a peripheral region; providing a metallic contact element on said inner region of said active surface; providing a bonding pad at the periphery of said active surface; and bonding a light emitting element with a lower contact electrode to said metallic contact so as to cover said contact.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
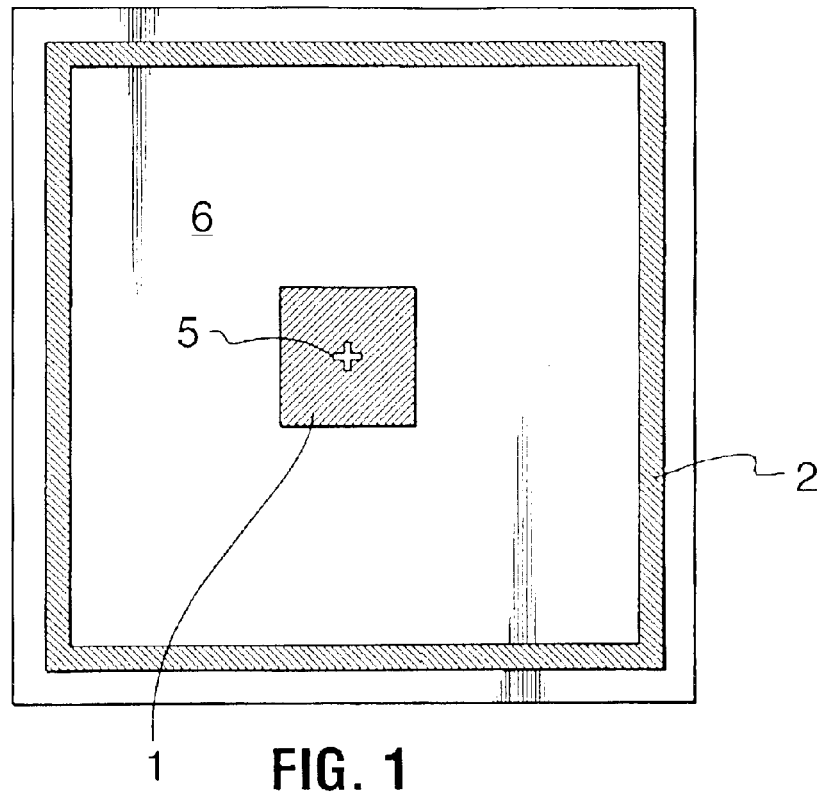
FIG. 1 is a plan view of a part of photonic device without the VCSEL in accordance with a preferred embodiment of the invention.
Figure 2:
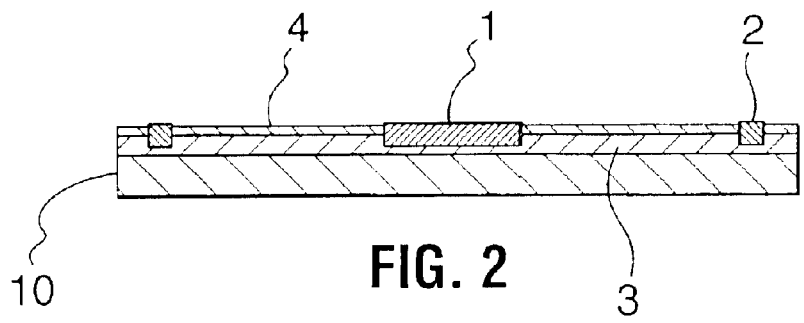
FIG. 2 is a cross-sectional view of the embodiment shown in FIG. 1.

Referring now to FIGS. 1 and 2, a substrate 10 comprises a PIN diode with an upper p-type layer 3 forming an active photosensitive surface 6. The PIN diode includes a lower n-type layer and intrinsic layer in a conventional manner and is of the type, for example, described in described in U.S. Pat. No. 5,812,582, the contents of which are herein incorporated by reference. The doping of the p-type layer can be enhanced if desired to increase is conductivity so long as the functioning of the PIN diode is not significantly impaired.

On the p-layer 3 is deposited a square metallic contact pad 1 at the centre of the active photosensitive surface 6. A central alignment mark 5 is formed on the contact pad 1 to facilitate subsequent assembly of the complete device. Since this mark is formed on the contact pad 1, it will not affect the performance of the PIN diode.

A VCSEL (not shown), of the type, for example, described in U.S. Pat. No. 5,812,582, is mounted over the contact pad 1 so as to completely cover it, i.e. so that none of the contact pad is exposed from outside the footprint of the VCSEL. The VCSEL has a lower electrode that is bonded to the contact pad 1 by solder or conductive glue, for example, conductive epoxy glue. The alignment mark 5 is used to ensure that the VCSEL is precisely located over the contact pad 1.

A rectangular peripheral metallic frame 2, which may be square, is deposited on the p-layer 3 to form a bonding pad for supplying electrical power to the central contact pad 1.

In accordance with the principles of the invention, the p-layer 3 which forms the upper layer of the PIN monitor diode also serves to supply current to the contact pad 1 for the centrally mounted VCSEL. This p-layer then provides a conductive path in substantially all radial directions from the peripheral frame 2 to the central contact pad 1.

The size of the contact pad 1 depends on the size of the overall device. In order to make the monitor as efficient as possible, the contact pad 1 should be smaller than the area covered by the VCSEL and should not extend beyond the area covered by the VCSEL.

A passivation or antireflective layer 4 can be deposited over the p-type layer 3 in a conventional manner.

Typically the depth of the p-type layer 3 is about 1 $\mu$m with a p doping level of $10^{19}$ atoms/cm$^2$. The length of each side of the active area is typically in the order of 300 $\mu$m and the width 200 $\mu$m. Calculations show that the total resistance to the central contact pad 1 in the embodiment shown is in the order of 2.2$\Omega$, which is sufficient to handle the supply current for the central VCSEL, typically in the order of 20 mA. This gives a power dissipation in the layer 3 of less than 1 mW, which can easily be handled by the heat sink for the device.

In this specification, the orientation of the components is described for convenience as upper or lower etc. consistent with conventional usage, although it will of course be understood that the device can be used in any orientation, and such language is not intended to be construed as limiting.

We claim:

1. A photonic device comprising:
   a semiconductor substrate having an active photosensitive surface for generating a photocurrent dependent on the intensity of light falling thereon;
   a metallic contact element formed on said active surface;
   a light emitting element having a lower electrode, said light emitting element being disposed on said active surface to cover said metallic contact element with said lower electrode bonded to said contact element;
   a peripheral bonding pad for electrical connection to said contact element; and
   a doped conductive path within said substrate for establishing electrical connection between said contact element and said peripheral bonding pad.

2. A photonic device as claimed in claim 1, wherein said metallic contact element is located centrally on said active surface.

3. A photonic device as claimed in claim 2, further comprising a passivation layer extending over said active surface.

4. A photonic device as claimed in claim 1, wherein said peripheral bonding pad is in the form of a frame extending substantially entirely around the periphery of said active area.

5. A photonic device as claimed in claim 4, wherein said conductive path is provided by a conductive layer so that current flows in multiple radial directions to said bonding pad.

6. A photonic device as claimed in claim 5, wherein said frame is generally rectangular.

7. A photonic device as claimed in claim 5, wherein said conductive layer forms part of a PIN diode.

8. A photonic device as claimed in claim 7, wherein said conductive layer is an upper active layer of a PIN diode.

9. A photonic device as claimed in claim 8, wherein said conductive layer is a p-type layer of a PIN diode.

10. A photonic device as claimed in claim 7, wherein said light emitting element is a VCSEL.

11. A method of making a photonic device comprising:
    providing a semiconductor substrate having a photosensitive active surface, said semiconductor substrate having a doped layer providing a conductive path between an inner region thereof and a peripheral region;
    providing a metallic contact element on said inner region of said active surface;
    providing a bonding pad at the periphery of said active surface; and
    bonding a light emitting element with a lower contact electrode to said metallic contact so as to cover said contact.

12. A method as claimed in claim 11, wherein an alignment mark is formed on said contact element to permit precise alignment of said light emitting element.

13. A method as claimed in claim 12, wherein said bonding pad is in the form of a frame extending around the periphery of said active surface.

14. A method as claimed in claim 11, further comprising depositing a passivation layer over said active surface.

15. A method as claimed in claim 14, wherein said passivation layer is also an anti-reflective coating.

16. A method as claimed in claim 11, wherein said light emitting element is bonded to said contact element with conductive glue.

17. A method as claimed in claim 11, wherein said light emitting element is soldered to said contact element.

18. A method as claimed in claim 13, wherein said active surface forms part of a PIN diode, and said conductive path is formed by upper layer of said PIN diode.

19. A method as claimed in claim 18, wherein said upper layer is doped over substantially its entire active area so that current flows radially in substantially all directions to said peripheral bonding pad.

20. A method as claimed in claim 19, wherein said contact element is centrally located within said active surface.

21. A method as claimed in claim 20, wherein said light emitting element is a VCSEL.

* * * * *